(12) United States Patent
Kainuma

(10) Patent No.: US 9,013,048 B2
(45) Date of Patent: Apr. 21, 2015

(54) SEMICONDUCTOR DEVICE MANUFACTURING METHOD AND SEMICONDUCTOR DEVICE

(71) Applicant: Fujitsu Limited, Kawasaki-shi, Kanagawa (JP)

(72) Inventor: Norio Kainuma, Nagano (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/193,128

(22) Filed: Feb. 28, 2014

(65) Prior Publication Data

US 2014/0339713 A1    Nov. 20, 2014

(30) Foreign Application Priority Data

May 17, 2013    (JP) .................................. 2013-104823

(51) Int. Cl.
*H01L 21/66* (2006.01)
*H01L 23/31* (2006.01)

(52) U.S. Cl.
CPC ............ *H01L 22/12* (2013.01); *H01L 23/3142* (2013.01)

(58) Field of Classification Search
USPC ............................................... 257/787; 438/5
See application file for complete search history.

(56) References Cited

U.S. PATENT DOCUMENTS

| 2003/0013233 | A1* | 1/2003 | Shibata | ......................... 438/114 |
| 2003/0082854 | A1 | 5/2003 | Kasahara et al. | |
| 2006/0273434 | A1* | 12/2006 | Shibata | ......................... 257/673 |

FOREIGN PATENT DOCUMENTS

| JP | 2003-133499 A | 5/2003 |
| JP | 2003-218144 A | 7/2003 |
| JP | 2011-223014 A | 11/2011 |

* cited by examiner

*Primary Examiner* — Roy Potter
(74) *Attorney, Agent, or Firm* — Squire Patton Boggs (US) LLP

(57) ABSTRACT

A semiconductor device manufacturing method includes sealing a first surface of a semiconductor wafer with a resin, causing a resin-made warp suppression member to be adhered to a second surface on the opposite side of the first surface of the semiconductor wafer and causing the warp suppression member to shrink, measuring the amount of warp of the semiconductor wafer, and forming cuts in the warp suppression member in accordance with the amount of warp of the semiconductor wafer.

8 Claims, 7 Drawing Sheets

SEMICONDUCTOR DEVICE MANUFACTURING METHOD AND SEMICONDUCTOR DEVICE

CROSS-REFERENCE TO RELATED APPLICATION

This application is based upon and claims the benefit of priority from the prior Japanese Patent Application No. 2013-104823 filed on May 17, 2013, the entire contents of which are incorporated herein by reference.

FIELD

The embodiment discussed herein is related to a semiconductor device manufacturing method and a semiconductor device.

BACKGROUND

In recent years, further miniaturization and thinning of electronic devices have been promoted, and miniaturization and thinning have also been desired for the electronic components of semiconductor devices and the like. In order to meet such a requirement, wafer level packages that are implemented in a wafer state up to the packaging operation have been developed and put into practical use.

In wafer level packages, after the element-forming surface of a semiconductor wafer has been sealed with a mold resin, thinning is performed by grinding (backgrinding) the surface of the semiconductor wafer on the opposite side to the element-forming surface.

Japanese Laid-open Patent Publication No. 2003-218144, Japanese Laid-open Patent Publication No. 2003-133499, and Japanese Laid-open Patent Publication No. 2011-223014 are examples of related art.

An objective is to provide a semiconductor device manufacturing method with which a warp of a semiconductor wafer is able to be suitably corrected, and a semiconductor device in which a warp has been suitably corrected.

SUMMARY

According to an aspect of the invention, a semiconductor device manufacturing method includes sealing a first surface of a semiconductor wafer with a resin; causing a resin-made warp suppression member to be adhered to a second surface on the opposite side of the first surface of the semiconductor wafer, and causing the warp suppression member to shrink; measuring the amount of warp of the semiconductor wafer; and forming cuts in the warp suppression member in accordance with the amount of warp of the semiconductor wafer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereafter, before describing an embodiment, preliminary matters for facilitating an understanding of the embodiment are described.

Figure 1:
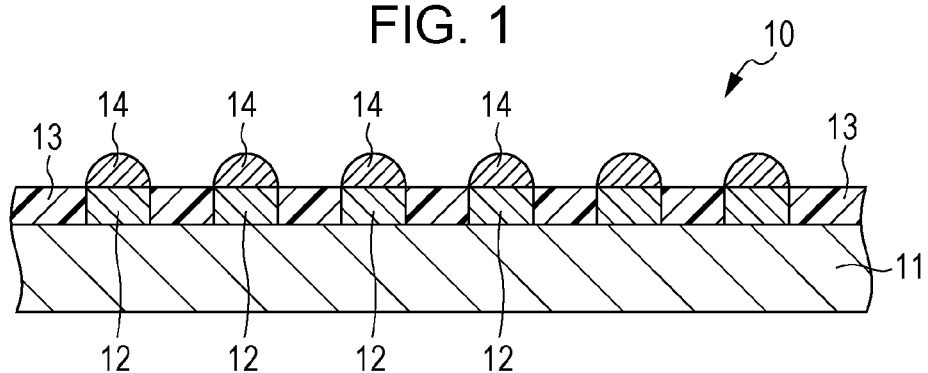
FIG. 1 is a schematic cross-sectional view depicting an example of a wafer level package-type semiconductor device.

FIG. 1 is a drawing depicting an example of a wafer level package-type semiconductor device. The wafer level package-type semiconductor device is formed by elements and wiring and so forth being formed in semiconductor device-forming regions in a wafer state, and then being diced between the semiconductor device-forming regions by a dicing blade.

The wafer level package-type semiconductor device 10 illustrated in FIG. 1 has a semiconductor substrate 11, electrodes 12, a mold resin 13, and solder balls 14. It ought to be noted that, in the present application, the semiconductor wafer after having been diced into semiconductor device-forming regions is referred to as a semiconductor substrate.

Elements such as transistors and wiring (not depicted) are formed on the element-forming surface (upper-side surface in FIG. 1) side of the semiconductor substrate 11. The electrodes 12, which are also referred to as metal posts, are electrically connected to the elements formed on the semiconductor substrate 11. Furthermore, the element-forming surface of the semiconductor substrate 11 is sealed by using the mold resin 13.

The solder balls 14 are formed on the electrodes 12, and the semiconductor device 10 and a circuit board are electrically and mechanically connected by way of these solder balls 14.

Figure 2:
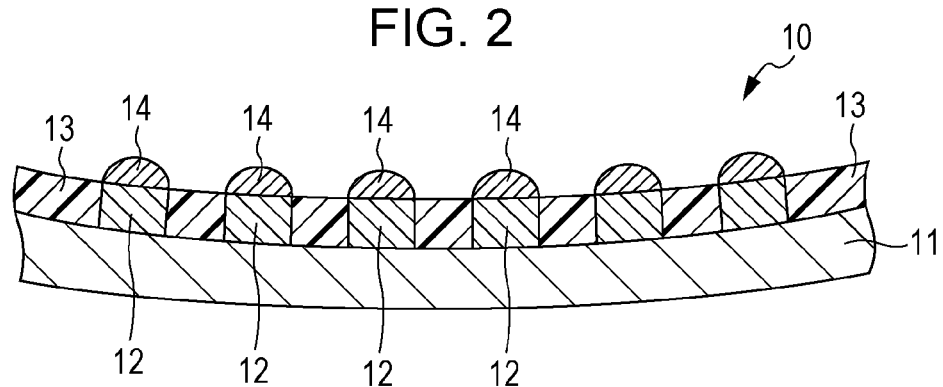
FIG. 2 is a schematic cross-sectional view depicting a warped semiconductor device.
Figure 3:
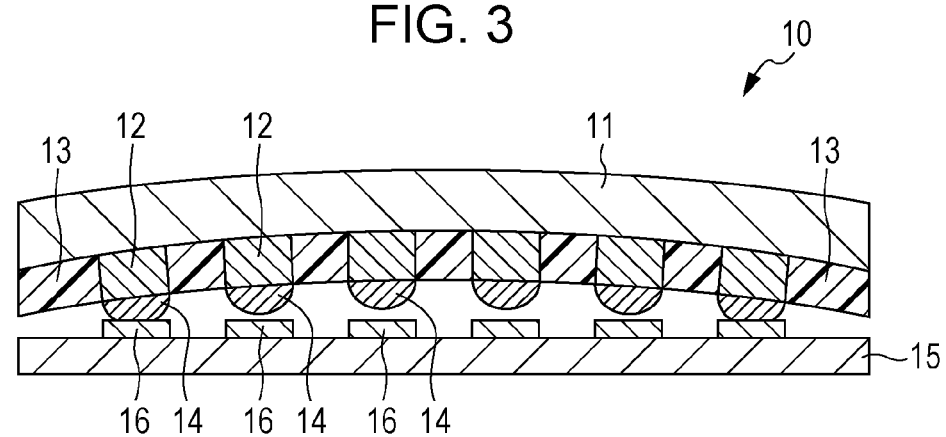
FIG. 3 is a schematic cross-sectional view depicting a problem that arises when a warped semiconductor device is mounted on a circuit board.

Incidentally, since the mold resin 13 generally shrinks as it hardens, warping occurs in the semiconductor device 10, as in FIG. 2. If a large warp occurs in the semiconductor device 10, as in FIG. 3, when mounted on a circuit board 15 it is not possible for the solder balls 14 in the central section of the semiconductor device 10 to come into contact with the electrodes 16 of the circuit board 15, and there is a poor connection.

Since the solder balls 14 melt when the semiconductor device 10 is mounted on the circuit board 15, a poor connection does not occur as long as the warp is slightly smaller than the height of the solder balls 14. However, in recent years, there has been a trend for the size of solder balls 14 to be reduced as the number of the terminals of semiconductor devices 10 has increased, and the permissible amount of warp has decreased.

Furthermore, in recent years, circuit boards equipped with semiconductor devices (hereafter referred to as "semiconductor device-equipped boards") have been developed. If there is a large warp in the semiconductor device 10 when a semiconductor device-equipped board is manufactured, the problems described below occur.

Figure 4A:
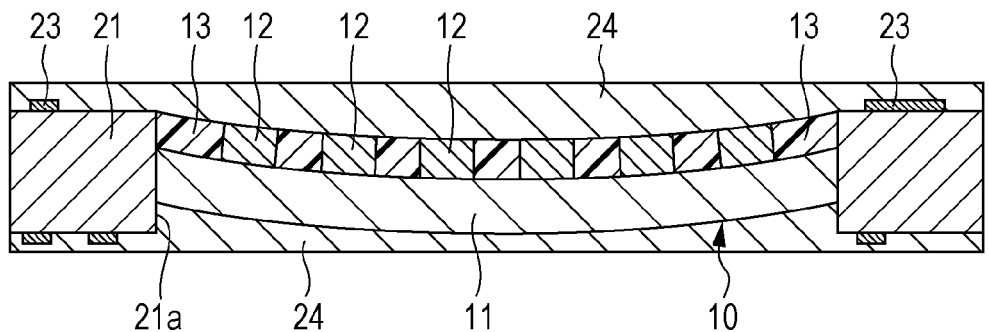
FIGS. 4A-4C are schematic cross-sectional views illustrating, in order of the operations, a manufacturing method for a semiconductor device-equipped board.
Figure 4B:
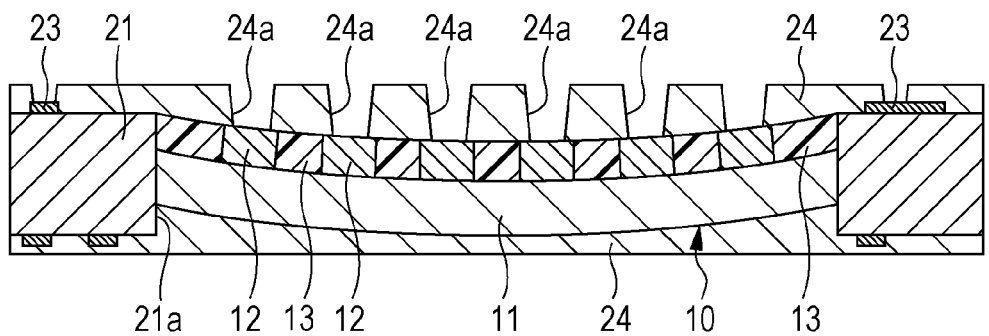
Figure 4C:
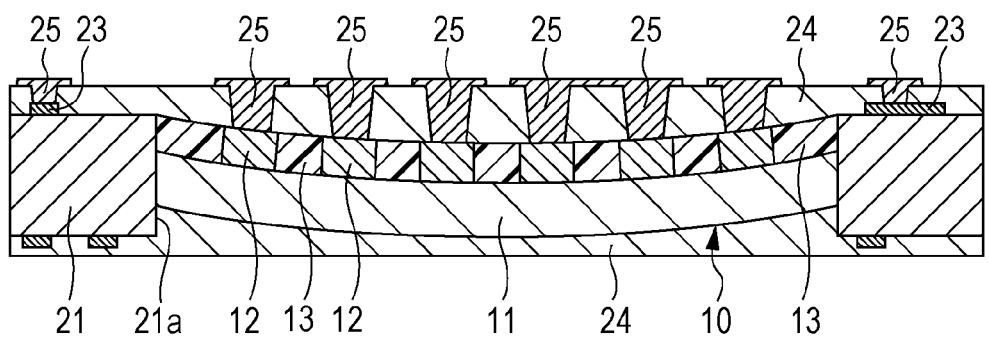

FIGS. 4A-4C are schematic cross-sectional views illustrating, in order of the operations, a manufacturing method for a semiconductor device-equipped board. It ought to be noted that, in the case where a semiconductor device-equipped board is manufactured, the solder balls 14 depicted in FIG. 1 are not desired. Furthermore, in FIGS. 4A-4C, the same symbols are appended to the same objects as in FIG. 1.

First, as depicted in FIG. 4A, an opening 21a is provided in a circuit board 21 on which wiring 23 and so forth has been formed, and a semiconductor device 10 is arranged within the opening 21a. Thereafter, prepregs 24 are joined onto both surfaces of the circuit board 21, and the semiconductor device 10 is tightly sealed within the opening 21a.

Next, as depicted in FIG. 4B, holes 24a are formed a prepreg 24 by a laser, and the electrodes 12 and the front surfaces of the desired wiring 23 are exposed. Thereafter, as depicted in FIG. 4C, a conductive material such as copper (Cu) is embedded in the holes 24a of the prepreg 24, and contact vias 25 are formed.

In this kind of manufacturing method for a semiconductor device-equipped board, if the warp of the semiconductor device 10 is large, the distance from the front surface of the prepreg 24 to the electrodes 12 in the central section of the semiconductor device 10 increases. Therefore, when the holes 24a are formed by the laser, the holes 24a may not reach the electrodes 12, and the radii of the holes 24a in the front surfaces of the electrodes 12 may decrease, and poor connections may occur between the contact vias 25 and the electrodes 12.

It is possible to increase the depths of the holes 24a by increasing the laser power; however, in that case the radii of the holes 24a in the front surface of the prepreg 24 increase, and there is a risk of a defect such as short-circuiting occurring between adjacent contact vias 25.

In order to resolve the problems caused by the warping of the semiconductor wafer, it has been proposed to affix a warp suppression sheet to the rear surface side of the semiconductor wafer, and thereafter subject the warp suppression sheet to thermal shrinking to correct the warping.

However, in wafer level package-type semiconductor devices, because the thickness of the semiconductor wafer is different for each lot when backgrinding is performed, it is difficult to suitably correct the warping of a semiconductor wafer by merely affixing and subjecting a warp suppression sheet to thermal shrinking.

In the following embodiment, an explanation is given with respect to a semiconductor device manufacturing method with which the warping of a semiconductor wafer is able to be suitably corrected, and a semiconductor device manufactured by this manufacturing method.

EMBODIMENT

FIGS. 5A-5E are cross-sectional views illustrating, in order of the operations, a semiconductor device manufacturing method according to an embodiment.

Figure 5A:
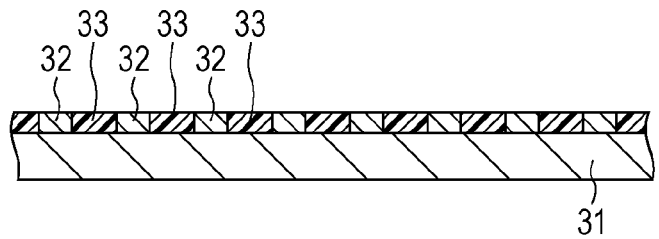
FIGS. 5A-5E are cross-sectional views illustrating, in order of the operations, a semiconductor device manufacturing method according to an embodiment.
Figure 6:
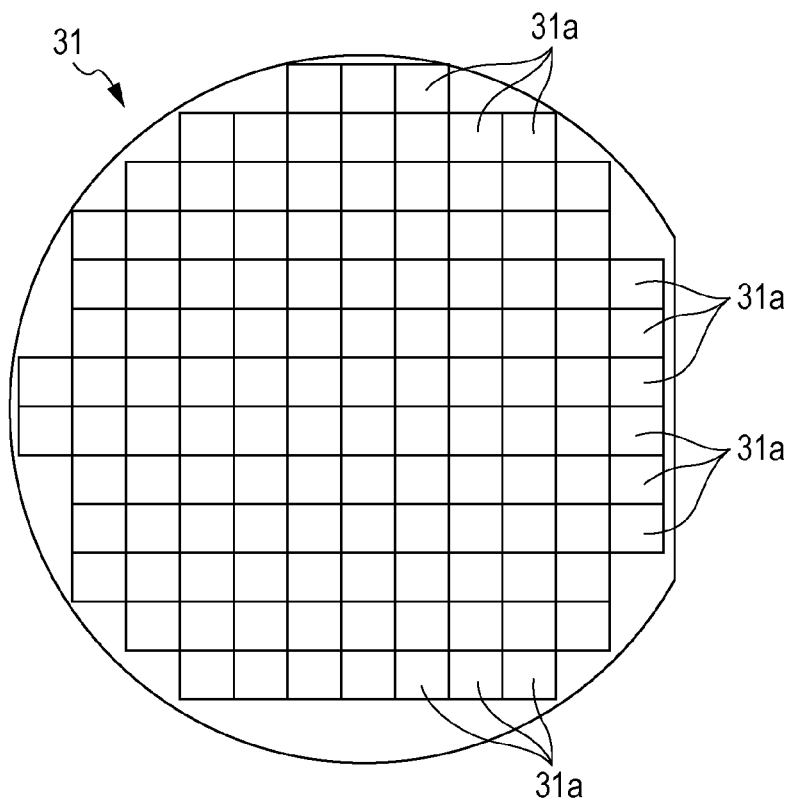
FIG. 6 is a plan view depicting a state in which a semiconductor wafer is divided into a plurality of semiconductor device-forming regions.

First, a semiconductor wafer 31, which is depicted in FIG. 5A, is prepared. As schematically depicted in the plan view of FIG. 6, the semiconductor wafer 31 is divided into a plurality of semiconductor device-forming regions 31a. Elements such as transistors and wiring (not depicted) are then formed on an element-forming surface (first surface) side of the semiconductor device-forming regions 31a. Furthermore, the semiconductor wafer 31 is thinned by grinding (backgrinding) the surface (second surface) on the opposite side to the element-forming surface.

Next, electrodes 32 are formed of a metal such as copper (Cu) on the element-forming surface side of the semiconductor wafer 31. Thereafter, once the semiconductor wafer 31 has been arranged in a metal mold, a mold resin 33 is injected into the metal mold, and the element-forming surface of the semiconductor wafer 31 is sealed with the mold resin 33. Next, the semiconductor wafer 31 is removed from the metal mold. During this process, warping occurs in the semiconductor wafer 31 due to stress that is generated as the mold resin 33 hardens.

Figure 5B:
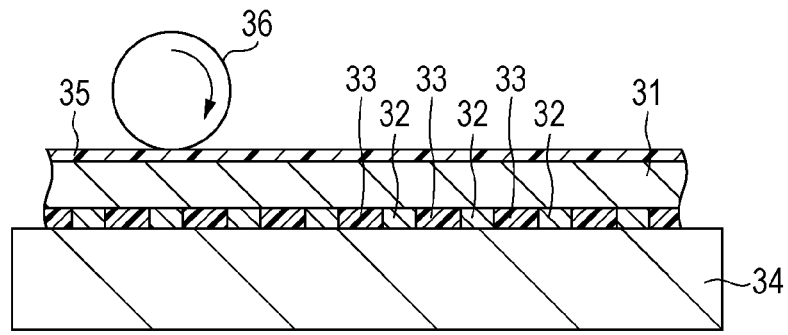

Next, as depicted in FIG. 5B, the semiconductor wafer 31 is placed on a surface plate 34 with the mold resin 33 side being at the bottom, and a warp suppression sheet 35 is affixed to the rear surface (surface on the opposite side to the element-forming surface) of the semiconductor wafer 31.

At such time, it is preferable for a roller 36 for example to be used for the warp suppression sheet 35 to be sufficiently adhered to the rear surface of the semiconductor wafer 31. It is possible for a thermosetting epoxy resin sheet such as die attach film to be used as the warp suppression sheet 35.

Next, the warp suppression sheet 35 is heated. The warp suppression sheet 35 shrinks due to this heating, and the warp of the semiconductor wafer 31 is corrected. However, because the thickness of the semiconductor wafer 31 is different for each lot as previously mentioned, the warp of the semiconductor wafer 31 is not typically properly corrected at this stage.

Figure 7:
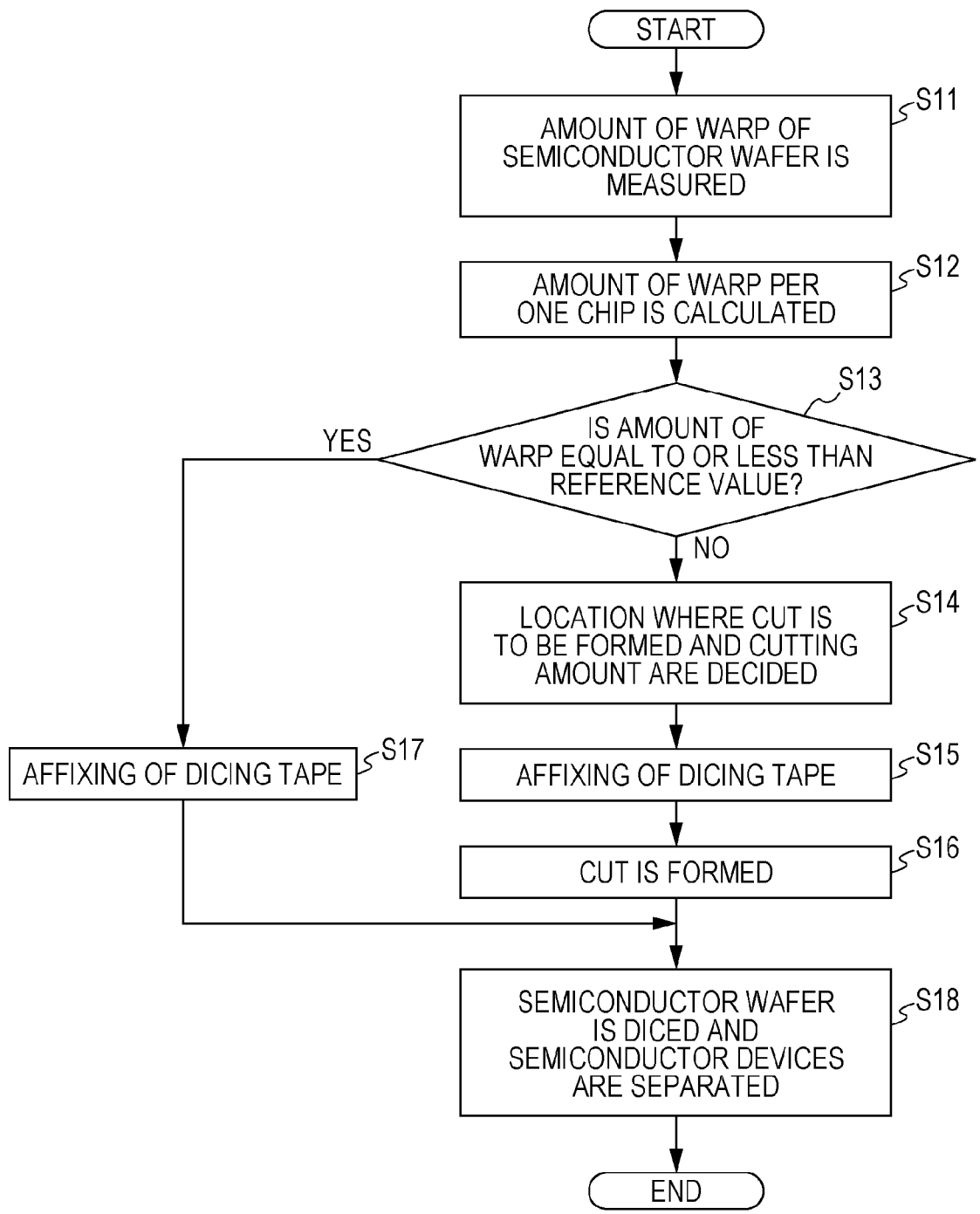
FIG. 7 is a drawing depicting the processing flow from measuring the warp of a semiconductor wafer to dicing the semiconductor wafer.

Next, the amount of warp of the semiconductor wafer 31 is measured, and it is determined whether or not additional correction has to be performed. If it is determined that additional correction has to be performed, the location and depth of a cut to be formed in the warp suppression sheet 35 are decided. FIG. 7 is a drawing depicting the processing flow from measuring the warp of a semiconductor wafer to dicing the semiconductor wafer.

Figure 5C:
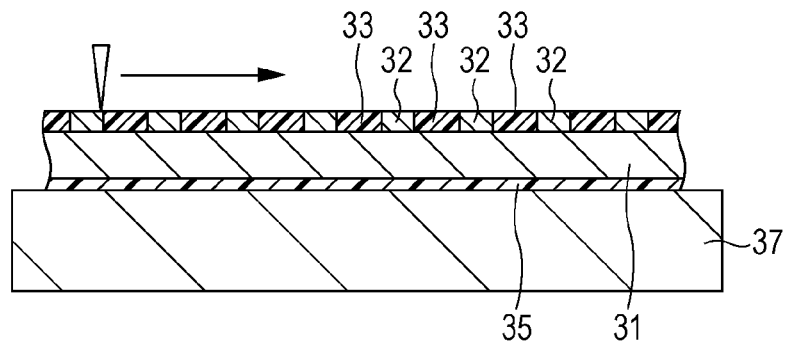

First, in operation S11, the amount of warp of the semiconductor wafer 31 is measured. A laser measurement device for example is used to measure the amount of warp. FIG. 5C schematically depicts a state in which the semiconductor wafer 31 is arranged on a surface plate 37 with the mold resin 33 side being at the top, and the amount of warp of the semiconductor wafer 31 is measured by the laser measurement device.

Next, processing moves to operation S12, and the amount of warp with respect to one semiconductor device-forming region 31a is calculated from the amount of warp of the semiconductor wafer 31. Hereafter, the amount of warp with respect to one semiconductor device-forming region 31a is referred to as the amount of warp per one chip.

Next, processing moves to operation S13, and it is determined whether or not the amount of warp per one chip is equal to or less than a preset permitted value (10 μm for example).

Processing moves to operation S17 if the amount of warp per one chip is equal to or less than the permitted value, and processing moves to operation S14 if the amount of warp per one chip exceeds the permitted value.

Operation S14 to operation S16 are operations in which cuts are formed in the warp suppression sheet 35 to alleviate the stress imparted to the semiconductor wafer 31 by the warp suppression sheet 35.

Figure 8:
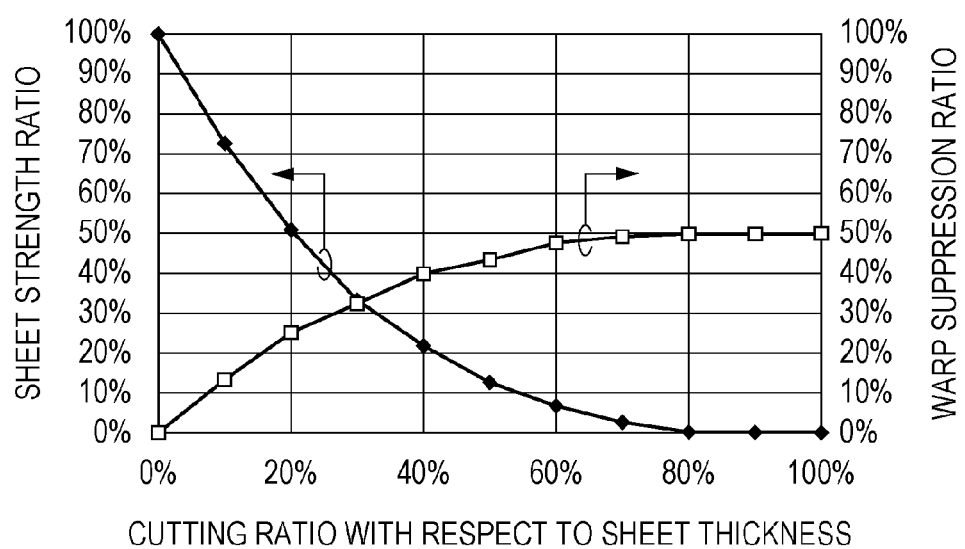
FIG. 8 is a drawing depicting the relationship between the cutting ratio of cuts formed in a warp suppression sheet, a sheet strength ratio, and a warp suppression ratio.

In FIG. 8, the cutting ratio of the cuts formed in the warp suppression sheet 35 are taken from the horizontal axis, the sheet strength ratio and warp suppression ratio are taken from the vertical axes, and the relationship therebetween is depicted. FIG. 8 depicts the relationship between the cutting ratio and the sheet strength and warp suppression ratios when a cut has been formed in the central portion of a semiconductor device-forming region 31a of the warp suppression sheet 35. Furthermore, in FIG. 8, the cutting ratio is the ratio of the cutting depth with respect to the thickness of the warp suppression sheet 35.

In step S14, data such as that depicted in FIG. 8 is used to calculate, from the amount of warp per one chip, what degree the warp suppression ratio ought to be for the warp to be equal to or less than the permitted value.

For example, in the case where the amount of warp is equal to or less than the permitted value if the amount of warp is less than 25%, it is understood from FIG. 8 that it is desirable for the cutting ratio of the cuts to be formed in the warp suppression sheet 35 to be 20%. Consequently, in this case, cuts having a cutting ratio of 20% are formed in the central portions of the semiconductor device-forming regions 31a of the warp suppression sheet 35.

Furthermore, it is understood from FIG. 8 that only 50% of the amount of warp is suppressed even if the cutting ratio is 100%. In the case where the amount of warp is to be further reduced, cuts are additionally formed between the cut formed in the center of a semiconductor device-forming region 31a and both ends of the semiconductor device-forming region 31a.

For example, when a cut having a cutting ratio of 100% is formed in the central portion of a semiconductor device-forming region, and cuts each having a cutting ratio of 20% are formed between the aforementioned cut and both ends of the semiconductor device-forming region, the warp suppression ratio becomes approximately 62.5%.

Figure 5D:
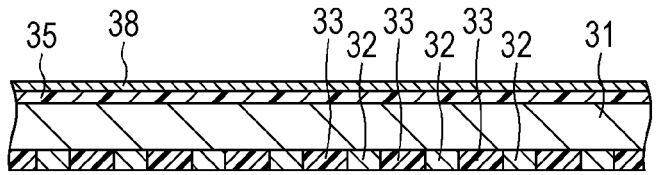

Once the locations and cutting ratios of the cuts to be formed in the warp suppression sheet 35 have been decided in operation S14 in this way, processing moves to operation S15. In operation S15, as depicted in FIG. 5D, a dicing tape 38 is affixed onto the warp suppression sheet 35.

Figure 5E:
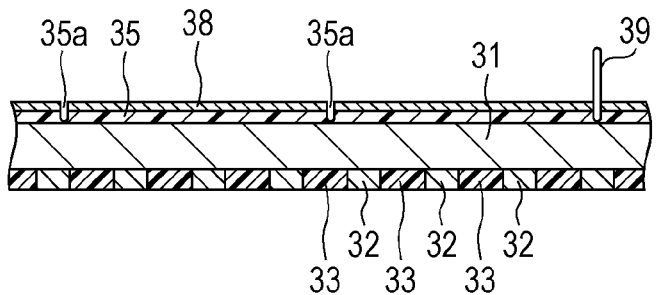

Processing then moves to operation S16 and, as depicted in FIG. 5E, cuts 35a are formed in the warp suppression sheet 35 from above the dicing tape 38 by a dicing blade 39 or a laser or the like. At such time, the cuts 35a are formed at the decided cutting ratio in the locations decided in operation S14.

Thereafter, processing moves to operation S18, and the semiconductor wafer 31 is diced into the semiconductor device-forming regions 31a by the dicing blade 39.

Alternatively, in the case where processing has moved from operation S13 to operation S17, further correction of the warping is not desired. Consequently, once the dicing tape 38 has been affixed to the rear surface side of the semiconductor wafer 31 in operation S17, processing moves to operation S18, and the semiconductor wafer 31 is diced into the semiconductor device-forming regions 31a by the dicing blade 39.

In this way, semiconductor devices in which the amount of warp has been suppressed to a permitted value or less are completed.

Figure 9A:
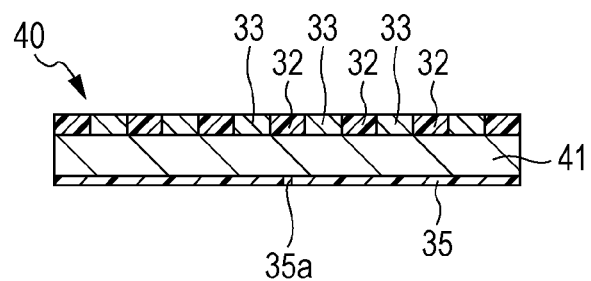
FIG. 9A is a cross-sectional view depicting an example of a semiconductor device manufactured by the method of the embodiment.
Figure 9B:
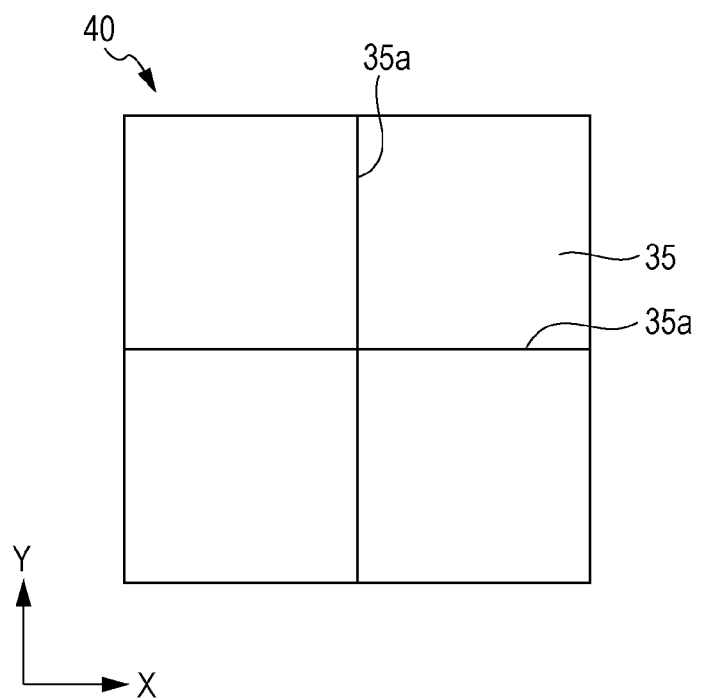
FIG. 9B is likewise a bottom view thereof.

FIG. 9A is a cross-sectional view depicting an example of a semiconductor device manufactured by the aforementioned method, and FIG. 9B is likewise a bottom view thereof.

The semiconductor device 40 depicted in FIGS. 9A and 9B has a semiconductor substrate 41, electrodes 32 formed on an element-forming surface side of the semiconductor substrate 41, a mold resin 33 that seals the element-forming surface of the semiconductor substrate 41, and a warp suppression sheet 35 that is affixed to the rear surface side of the semiconductor substrate 41. Cuts 35a are provided in the central portion of the warp suppression sheet 35 in the X-direction and Y-direction.

In the present embodiment, the amount of warp of the semiconductor wafer 31 after the element-forming surface has been sealed with the mold resin 33 is measured. Then, if the amount of warp per one chip exceeds the permitted value, cuts 35a are formed in the warp suppression sheet 35, and the warp is corrected. Thus, a semiconductor device in which warping has been corrected to a permitted value or less is obtained, and the generation of defects caused by the warping of the semiconductor device is avoided. As a result, the reliability of the semiconductor device is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. A semiconductor device manufacturing method comprising:
  sealing a first surface of a semiconductor wafer with a resin;
  causing a resin-made warp suppression member to be adhered to a second surface on the opposite side of the first surface of the semiconductor wafer, and causing the warp suppression member to shrink;
  measuring the amount of warp of the semiconductor wafer; and
  forming cuts in the warp suppression member in accordance with the amount of warp of the semiconductor wafer.
2. The semiconductor device manufacturing method according to claim 1,
  wherein the semiconductor wafer is divided into a plurality of semiconductor device-forming regions, and the cuts are formed in the semiconductor device-forming regions.
3. The semiconductor device manufacturing method according to claim 2,
  wherein the cuts are formed in the centers of the semiconductor device-forming regions.
4. The semiconductor device manufacturing method according to claim 1,
  wherein the warp suppression member is a thermosetting resin sheet.
5. The semiconductor device manufacturing method according to claim 1,
  wherein the depths of the cuts are decided from the relationship between a cutting ratio and a warp suppression ratio.
6. A semiconductor device comprising:
  a semiconductor substrate;
  a sealing resin that seals a first surface of the semiconductor substrate;
  a resin-made warp suppression member that is adhered to a second surface on the opposite side of the semiconductor wafer to the first surface; and
  cuts that are provided in the warp suppression member.

7. The semiconductor device according to claim 6, wherein the warp suppression member is formed of a thermosetting resin sheet.
8. The semiconductor device according to claim 6, wherein the cuts are formed in a location corresponding to the center of the semiconductor substrate.

* * * * *